United States Patent
Xie et al.

(10) Patent No.: US 10,242,982 B2
(45) Date of Patent: Mar. 26, 2019

(54) METHOD FOR FORMING A PROTECTION DEVICE HAVING AN INNER CONTACT SPACER AND THE RESULTING DEVICES

(71) Applicant: GLOBALFOUNDRIES Inc., Grand Cayman (KY)

(72) Inventors: Ruilong Xie, Niskayuna, NY (US); Katsunori Onishi, Somers, NY (US); Tek Po Rinus Lee, Ballston Spa, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/455,313

(22) Filed: Mar. 10, 2017

(65) Prior Publication Data
US 2018/0261595 A1 Sep. 13, 2018

(51) Int. Cl.
*H01L 27/088* (2006.01)
*H01L 29/66* (2006.01)
*H01L 21/8234* (2006.01)
*H01L 21/311* (2006.01)
*H01L 29/423* (2006.01)

(52) U.S. Cl.
CPC .... *H01L 27/0886* (2013.01); *H01L 21/31116* (2013.01); *H01L 21/823431* (2013.01); *H01L 21/823456* (2013.01); *H01L 21/823468* (2013.01); *H01L 21/823475* (2013.01); *H01L 29/42376* (2013.01); *H01L 29/66545* (2013.01)

(58) Field of Classification Search
CPC ............................................. H01L 21/823864
USPC .................................................... 257/E21.64
See application file for complete search history.

(56) References Cited

U.S. PATENT DOCUMENTS

| 6,333,219 B1 * | 12/2001 | Park | H01L 21/76897 257/E21.507 |
| 8,133,777 B1 * | 3/2012 | Chiang | H01L 21/76897 257/E21.433 |
| 9,190,488 B1 * | 11/2015 | Park | H01L 29/517 |
| 2003/0042552 A1 * | 3/2003 | Chae | H01L 21/28518 257/384 |

(Continued)

FOREIGN PATENT DOCUMENTS

TW  201303979 A1  1/2013

OTHER PUBLICATIONS

Translation of Taiwanese Examination Report dated Dec. 6, 2018, for Taiwanese patent application No. 106145753.

*Primary Examiner* — Charles D Garber
*Assistant Examiner* — Xiaoming Liu
(74) *Attorney, Agent, or Firm* — Amerson Law Firm, PLLC

(57) ABSTRACT

A method includes forming a first plurality of gate structures. A second plurality of gate structures is formed. A first spacer is formed on each of the first and second pluralities of gate structures. A first cavity is defined between the first spacers of a first pair of the first plurality of gate structures. A second cavity is defined between the first spacers of a second pair of the second plurality of gate structures. A second spacer is selectively formed in the second cavity on the first spacer of each of the gate structures of the second pair without forming the second spacer in the first cavity. A first contact is formed contacting the first spacers in the first cavity. A second contact is formed contacting the second spacers in the second cavity.

18 Claims, 10 Drawing Sheets

(56) References Cited

U.S. PATENT DOCUMENTS

2009/0218614 A1\* 9/2009 Aoyama .......... H01L 21/28247
257/324

\* cited by examiner

METHOD FOR FORMING A PROTECTION DEVICE HAVING AN INNER CONTACT SPACER AND THE RESULTING DEVICES

BACKGROUND OF THE INVENTION

1. Field of the Invention

The present disclosure generally relates to the fabrication of semiconductor devices, and, more particularly, to a method for forming a protection device having an inner contact spacer to increase dielectric isolation.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, finFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

A conventional FET is a planar device wherein the entire channel region of the device is formed parallel and slightly below the planar upper surface of the semiconducting substrate. In contrast to a planar FET, there are so-called 3D devices, such as an illustrative finFET device, which is a three-dimensional structure. Such finFET devices offer increased density and performance. FIG. 1 is a perspective view of an illustrative prior art finFET semiconductor device 100 that is formed above a semiconductor substrate 105 at an inter-mediate point during fabrication. In this example, the finFET device 100 includes three illustrative fins 110, an isolation material 130, a gate structure 115, sidewall spacers 120 and a gate cap layer 125. The fins 110 have a three-dimensional configuration: a height, a width, and an axial length. The portions of the fins 110 covered by the gate structure 115 are the channel regions of the finFET device 100, while the portions of the fins 110 positioned laterally outside of the spacers 120 are part of the source/drain regions of the device 100. Although not depicted, the portions of the fins 110 in the source/drain regions may have additional epi semiconductor material formed thereon in either a merged or unmerged condition.

However, in manufacturing modern IC products, different types of transistor devices are fabricated on the same substrate. Given the different structures and design requirements of the different types of devices, developing a process flow that allows for the efficient manufacture of such IC products with these different characteristics can be very challenging. For example, in some applications, a low voltage, high speed, finFET device may be fabricated on the same substrate that comprises a high voltage transistor device that is part of an input/output (I/O) circuit that is adapted to interface with outside power supplies. Such a high voltage device may be exposed to significantly higher operating voltages, e.g., 1.3 V or more (based upon today's technology), as compared to the operating voltages of other circuits within the product.

Current process integration schemes employ self-aligned contact processes, where spacers on the gate electrodes isolate adjacent source/drain contacts from the gate electrodes. Since the protection devices operate at higher voltages, reliability concerns may arise if the dielectric isolation provided by the spacers is not sufficient to prevent gate to contact dielectric breakdown.

The present disclosure is directed to various methods and resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming semiconductor devices. A method disclosed herein includes, among other things, forming a first plurality of gate structures. A second plurality of gate structures is formed. A first spacer is formed on each of the first and second pluralities of gate structures. A first cavity is defined between the first spacers of a first pair of the first plurality of gate structures. A second cavity is defined between the first spacers of a second pair of the second plurality of gate structures. A second spacer is selectively formed in the second cavity on the first spacer of each of the gate structures of the second pair without forming the second spacer in the first cavity. A first contact is formed contacting the first spacers in the first cavity. A second contact is formed contacting the second spacers in the second cavity.

Another illustrative method disclosed herein includes, among other things, forming a first plurality of gate structures. A second plurality of gate structures is formed. A first spacer having a first width is formed on each of the first plurality of gate structures. A first cavity is defined between the first spacers of a first pair of the first plurality of gate structures. A second spacer having a second width greater than the first width is formed on each of the second plurality of gate structures. A second cavity is defined between the second spacers of a second pair of the second plurality of gate structures. A first contact is formed contacting the first spacers in the first cavity. A second contact is formed contacting the second spacers in the second cavity.

One illustrative device disclosed herein includes, among other things, a first plurality of gate structures having a first threshold voltage. A second plurality of gate structures has a second threshold voltage greater than the first threshold voltage. A first spacer has a first width and is disposed on each of the first plurality of gate structures. A second spacer has a second width greater than the first width and is disposed on each of the second plurality of gate structures. A first contact contacts the first spacers of a first pair of the first plurality of gate structures. A second contact contacts the second spacers of a second pair of the second plurality of gate structures.

BRIEF DESCRIPTION OF THE DRAWINGS

The disclosure may be understood by reference to the following description taken in conjunction with the accompanying drawings, in which like reference numerals identify like elements, and in which.

Figure 1:
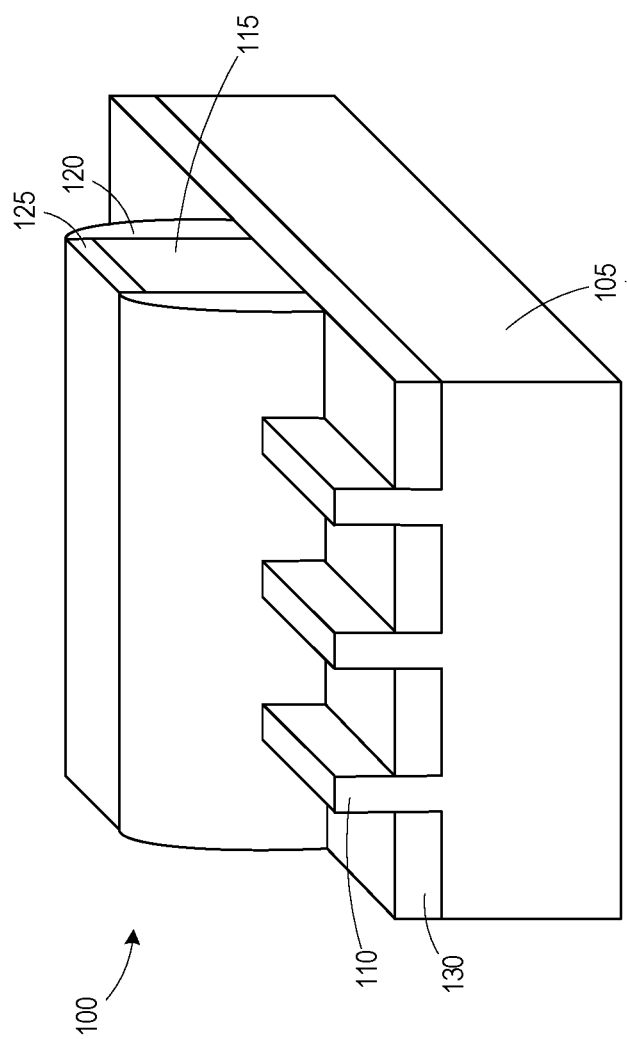
FIG. 1 schematically depicts an illustrative prior art finFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming transistor devices with inner contact spacers and the resulting devices. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

FIGS. 2A-2I illustrate various illustrative methods disclosed herein for forming an integrated circuit product 200. In the illustrated embodiment, the product includes finFET transistor devices, but the techniques described herein are not so limited, and they may be applied to other types of devices, such as planar devices. FIGS. 2A-2I show a cross-sectional view of the product 200 taken through the long axis of one of a first fin 205A formed in a substrate 210 in a first device region 215A and a second fin 205B formed in the substrate 210 in a second device region 215B. The cross-sectional view is taken in a direction corresponding to the gate length direction of the product 200. In some cases, the fins 205A, 205B may be portions of the same originally formed fin that extend across both of the device regions 215A, 215B. In other cases, the fins 205A, 205B may each be a part of a different originally formed fin. One or both of the fins 205A, 205B may comprise material different than the substrate 210.

In the illustrated embodiment, the fin 205A is part of an nominal transistor device 207A (e.g., low threshold voltage, high performance) and the fin 205B is part of a protection device 207B (e.g., high threshold voltage). The fins 205A, 205B may be silicon or silicon germanium (e.g., 25% germanium), or some combination thereof. A replacement process may be performed to replace some or all of the original silicon material of one or both of the fins 205A, 205B with silicon germanium.

In one illustrative embodiment, a replacement gate technique is used to form devices in the product 200. Placeholder gate structures 220A, 220B are formed above the fins 205A, 205B, respectively, prior to the formation of a replacement gate structure. The placeholder gate structures 220A, 220B each includes a sacrificial placeholder material 225A, 225B, such as polysilicon, and a gate insulation layer (not separately shown), such as silicon dioxide. Also depicted are illustrative gate cap layers 230A, 230B and sidewall spacers 235A, 235B, both of which may be made of a material such as silicon nitride. The size and materials of construction for the gates structures may be different in the different device regions 215A, 215B. For example, the placeholder gate structures 220B for the protection devices 207B have a greater gate length than the placeholder gate structures 220A for the transistor devices 207A. In the illustrated embodiment, the spacers 235A, 235B have the same widths. The spacers 235A, 235B may be formed concurrently by forming a conformal spacer layer above the gate structures 220A, 220B and etching the spacer layer to define the spacers 235A, 235B. In some embodiments, the gate cap layers 230A, 230B may include multiple layers, such as a first layer of silicon nitride on the placeholder gate structures 220A, 220B and a second layer of silicon oxide above the silicon nitride. Source and drain regions 240A, 240B are disposed between the gate structures 220A, 220B. Replacement processes may be used to form the source and drain regions 240A, 240B. The fins 205A, 205B may be recessed, and the material for the source and drain regions 240A, 240B may be epitaxially grown. The source and drain regions 240A, 240B may include a different material (e.g., silicon germanium, silicon carbide, silicon, etc.) than the fins 205A, 205B. The source and drain regions 240A, 240B may be doped in situ during the epitaxial growth process, or they may be doped by implantation using the placeholder gate structures 220A, 220B and spacers 235A, 235B as masks. Various other doped regions, e.g., halo implant regions, well regions and the like, may be formed, but are not depicted in the attached drawings.

The substrate 210 may have a variety of configurations, such as the depicted bulk silicon configuration. The substrate 210 may also have a silicon-on-insulator (SOI) configuration that includes a bulk silicon layer, a buried insulation layer and an active layer, wherein semiconductor devices are formed in and above the active layer. The substrate 210 may be formed of silicon or silicon germanium or it may be made of materials other than silicon, such as germanium. Thus, the terms "substrate" or "semiconductor substrate" should be understood to cover all semiconducting materials and all forms of such materials. The substrate 210 may have different layers. For example, the fins 205A, 205B may be formed in a process layer formed above the base layer of the substrate 210.

Figure 2A:
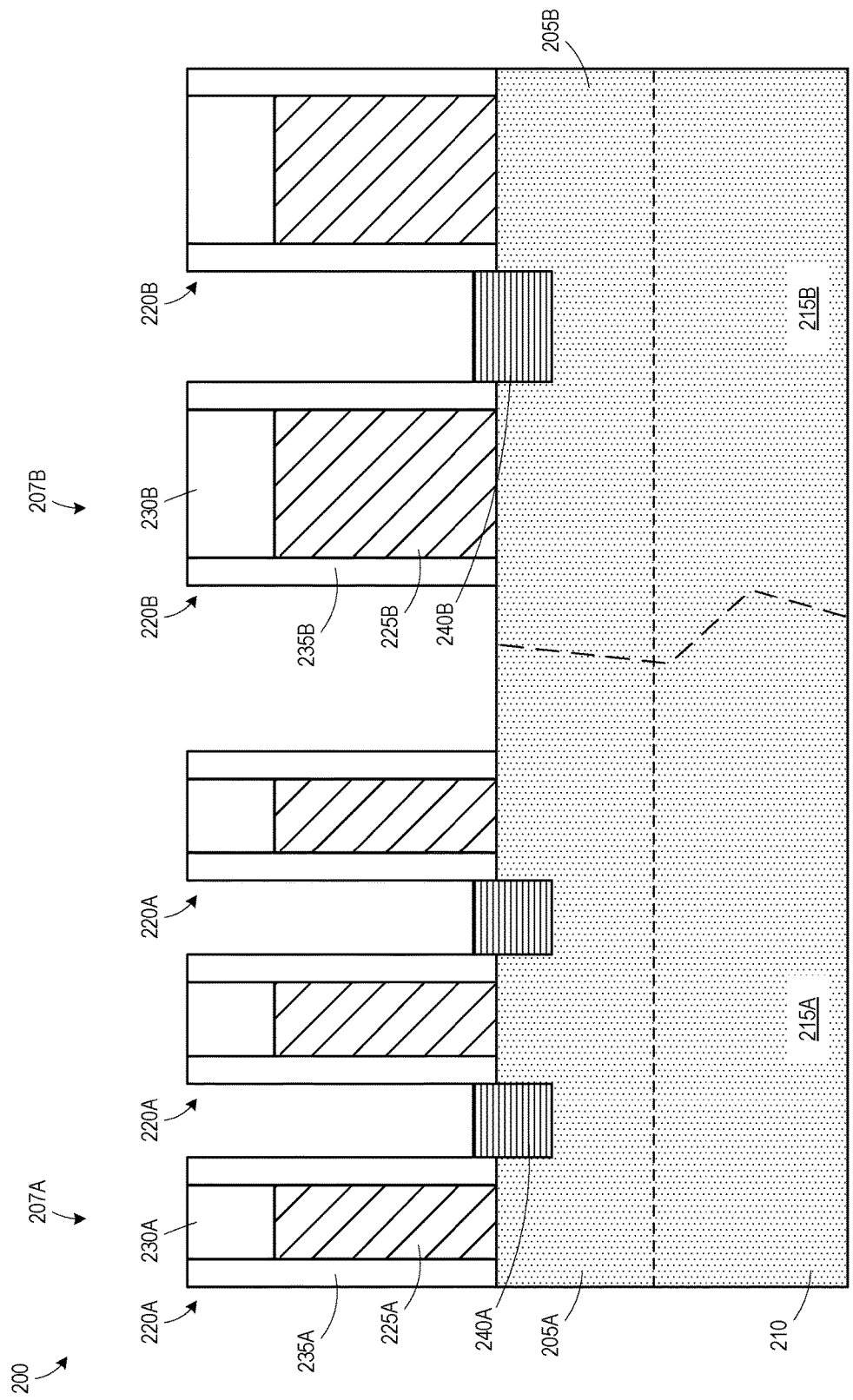
FIGS. 2A-2I depict various methods disclosed herein of forming transistor devices with inner contact spacers.
Figure 2B:
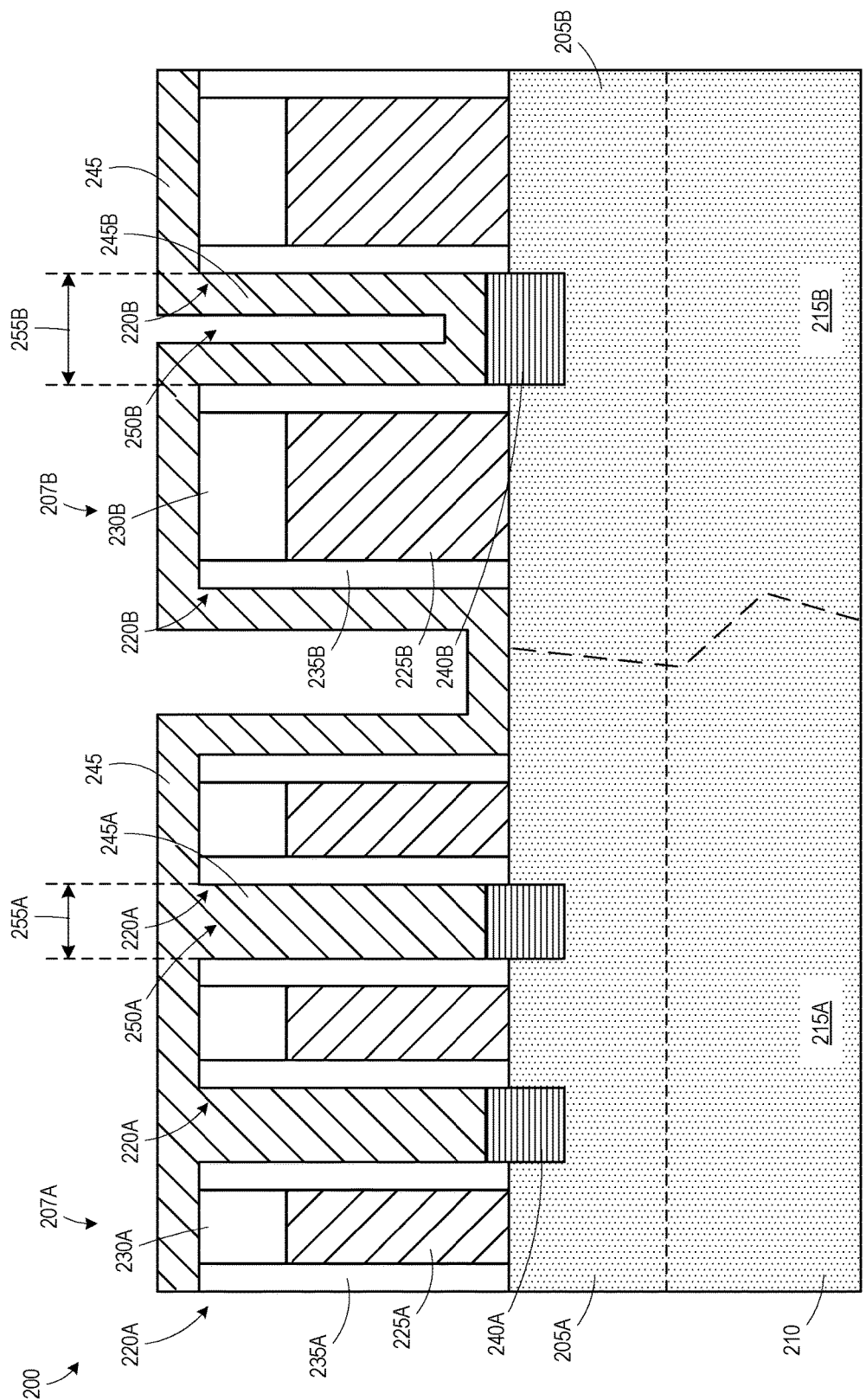

FIG. 2B illustrates the product 200 after a deposition process was performed to form a dielectric layer 245 (e.g., silicon dioxide) above the fins 205A, 205B and the placeholder gate structures 220A, 220B. In one embodiment, the deposition process may be a conformal deposition process, such as an atomic layer deposition (ALD) process. Employing a conformal deposition process provides a portion 245B of the dielectric layer 245 with a uniform thickness on vertical and horizontal surfaces of the placeholder gate structures 220B in a cavity 250B. However, since the spacing 255A between the placeholder gate structures 220A is less than the spacing 255B between the placeholder gate structures 220B (i.e., higher aspect ratio), a portion 245A of the dielectric layer 245 pinches off in the cavity 250A.

Figure 2C:
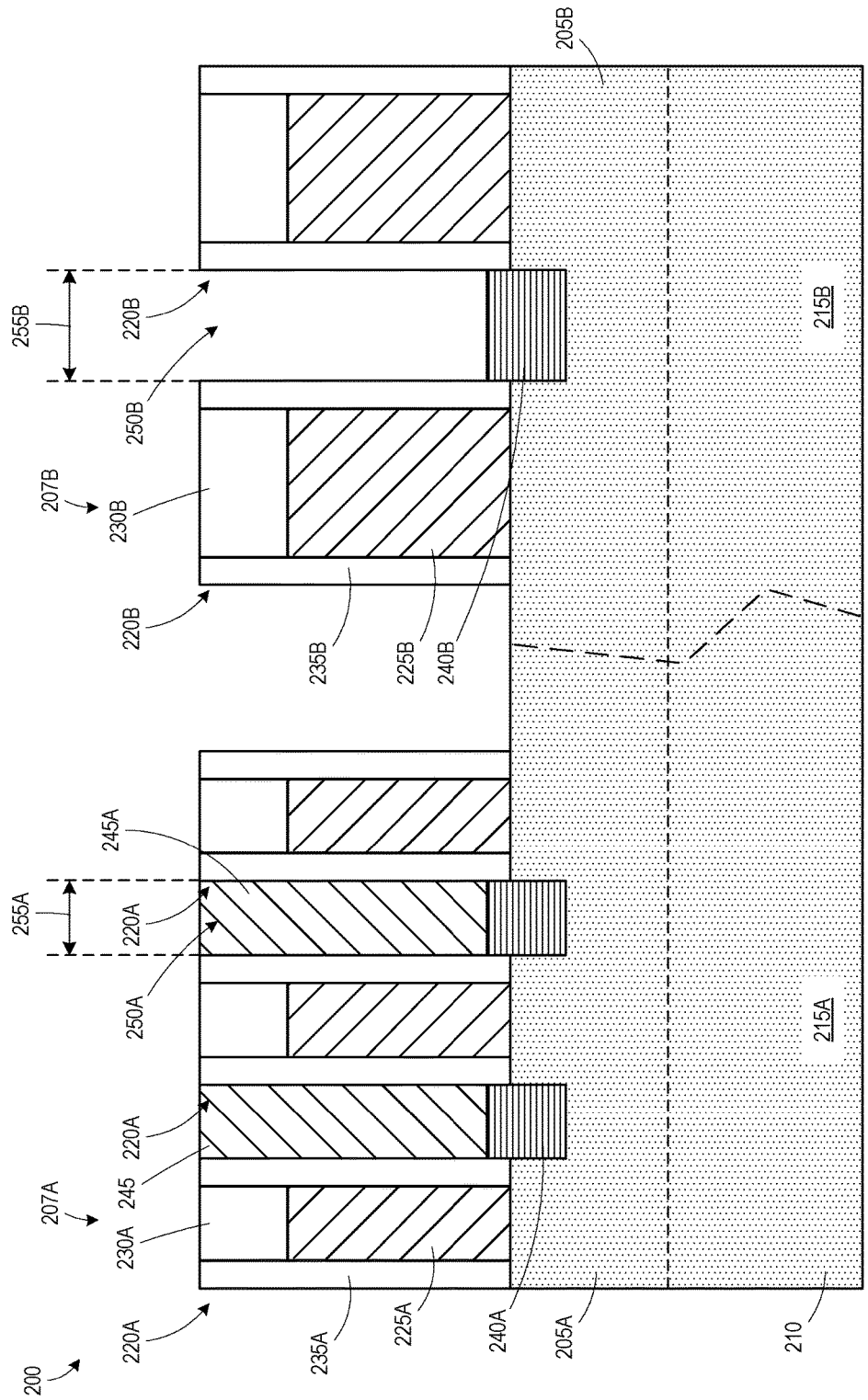

FIG. 2C illustrates the product 200 after an isotropic etch process was performed (e.g., DHF wet etch or a SiCoNi dry etch) to etch back the dielectric layer 245. Because the portion 245B of the dielectric layer 245 in the cavities 250B is conformal, the isotropic etch front proceeds on both horizontal and vertical surfaces, which removes the portion 245B of the dielectric layer 245 completely from within the cavities 250B. Due to the pinching off of the portion 245A of the dielectric layer 245 in the cavities 250A, the isotropic etch front only proceeds on the top surface, so the portion 245A of the dielectric layer 245 remains in the cavities 250A.

Figure 2D:
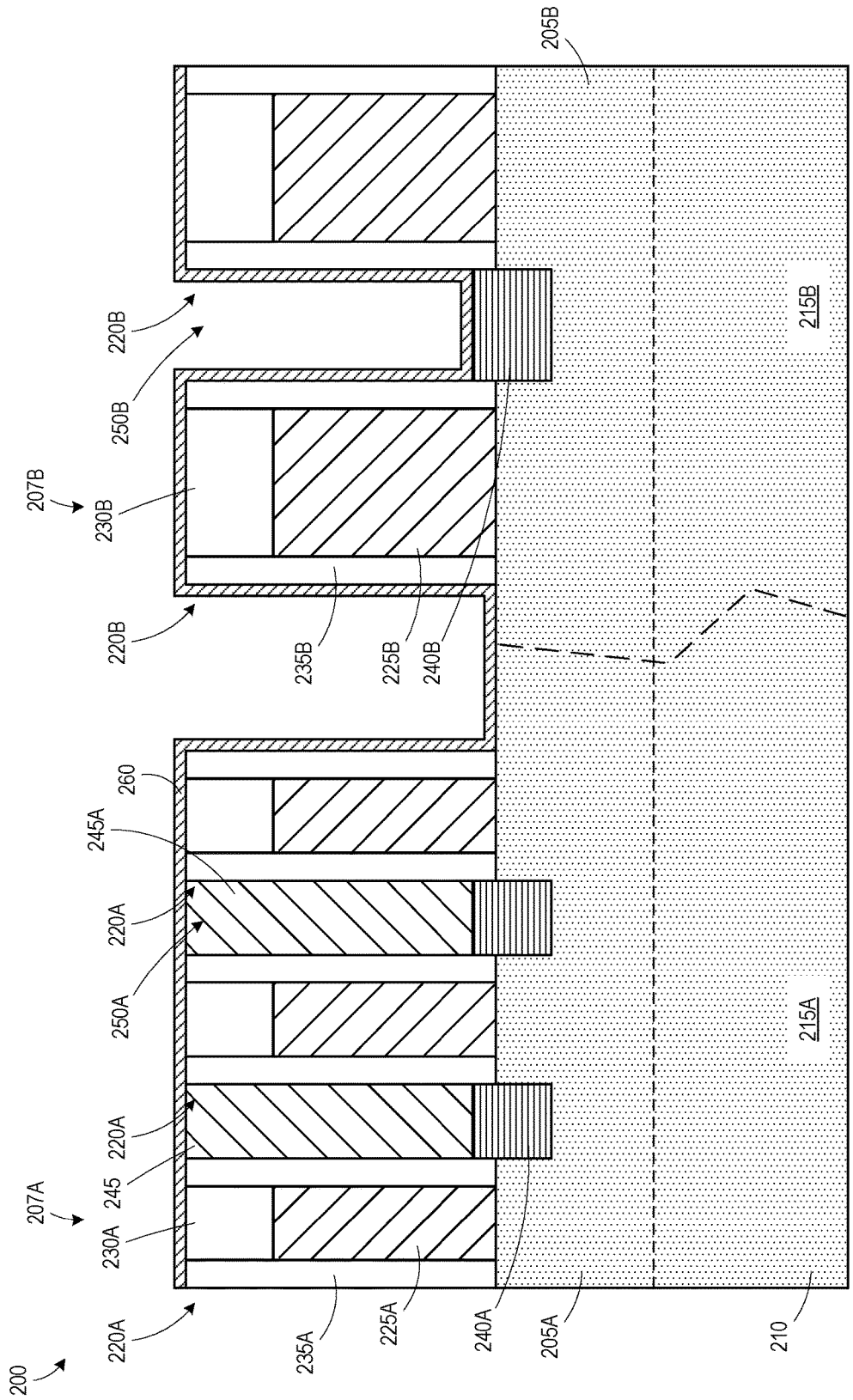

FIG. 2D illustrates the product after a conformal deposition process was performed to form a dielectric layer 260 (e.g., silicon nitride) above the fins 205A, 205B, the placeholder gate structures 220A, 220B, and in the cavities 250B.

Figure 2E:
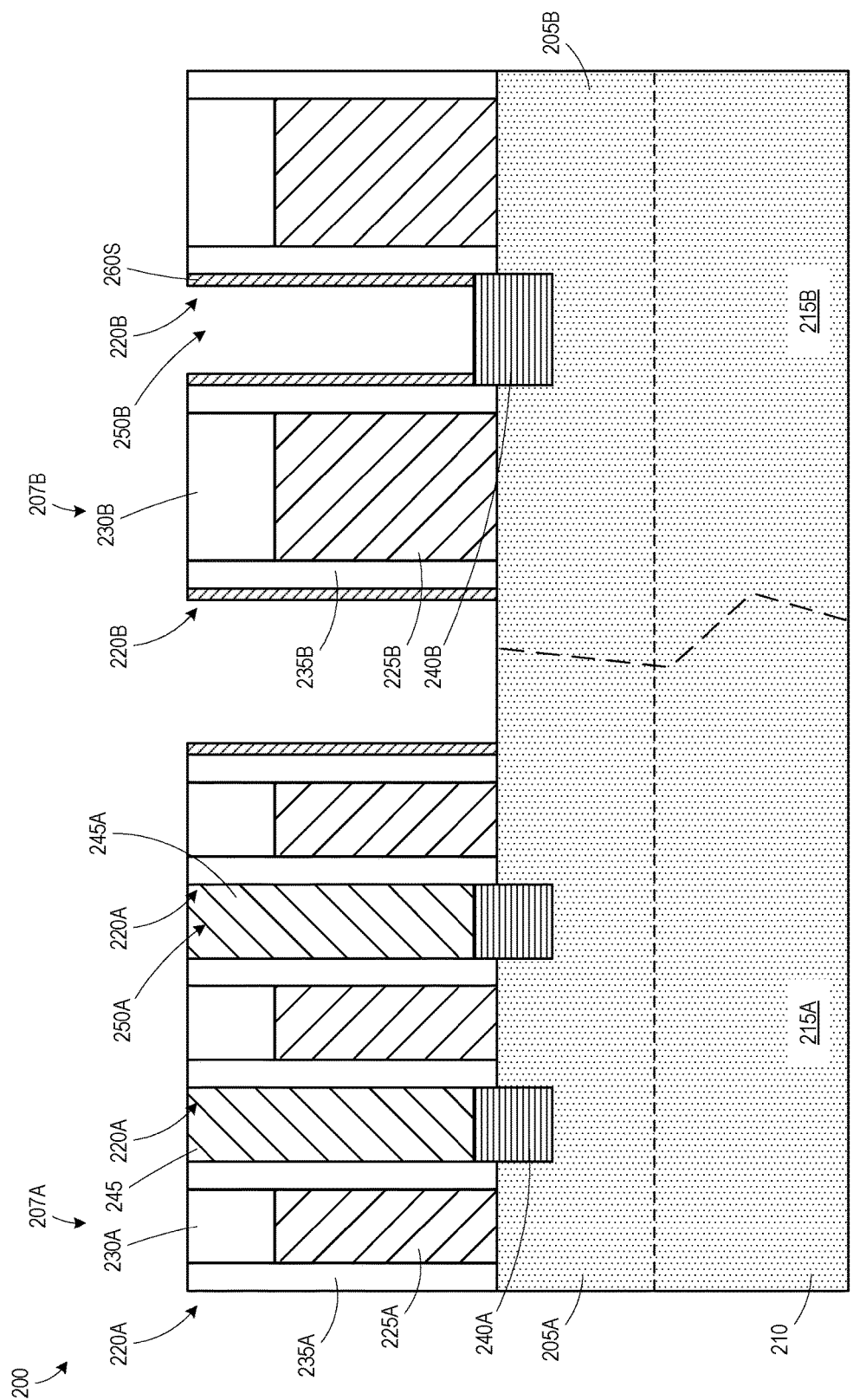

FIG. 2E illustrates the product after an anisotropic etch process was performed to etch the dielectric layer 260 to form spacers 260S in the cavities 250B. Since the portion 245A of the dielectric layer 245 remains in the cavities 250A, no spacers are formed in the cavities 250A. In embodiments where the spacers 235B and the 260S are formed of the same material (e.g., silicon nitride), they may be considered a single spacer having a wider width than the spacers 235A on the placeholder gate structures 220A.

Figure 2F:
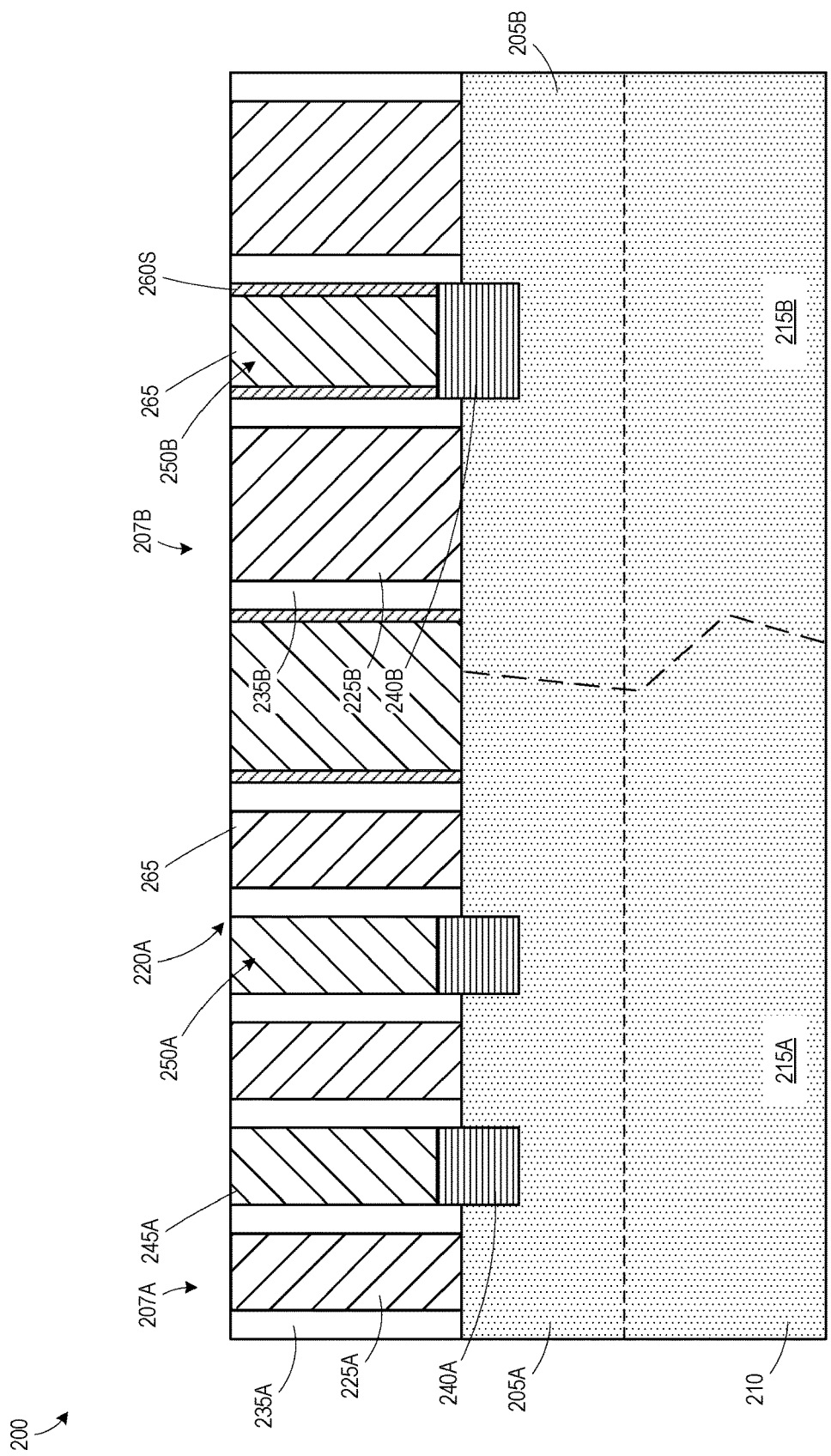

FIG. 2F illustrates the product after a plurality of processes was performed. A deposition process was performed to form a dielectric layer 265 above the above the fins 205A, 205B, the placeholder gate structures 220A, 220B, and in the cavities 250B. In some embodiments, the remaining portion 245A of the dielectric layer 245 may be removed prior to forming the dielectric layer 265, so the dielectric layer 265 may also be formed in the cavities 250A. A planarization process was performed to remove portions of the dielectric layer 265 and the gate cap layers 230A, 230B, thereby exposing top surfaces of the sacrificial placeholder material 225A, 225B. In the illustrated embodiment, the dielectric layer 265 may be silicon dioxide, a low-k dielectric material having a dielectric constant of approximately 3.0 or lower or an ultra-low-k (ULK) material having a dielectric constant of approximately 2.5 or lower.

Figure 2G:
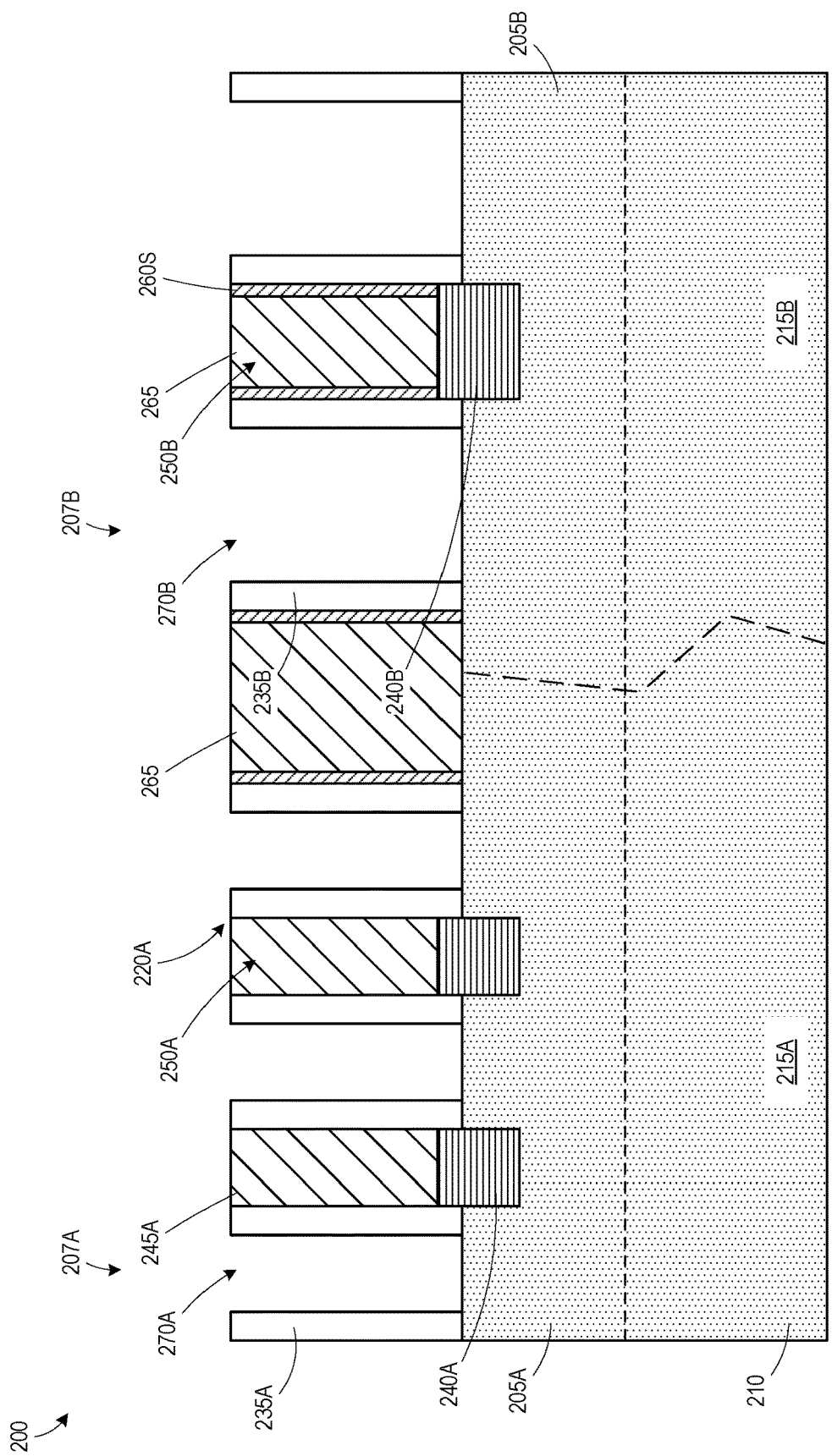

FIG. 2G illustrates the product 200 after a plurality of etch processes was performed to remove the sacrificial placeholder material 225A, 225B and any underlying gate dielectric layer, thereby defining gate cavities 270A, 270B.

Figure 2H:
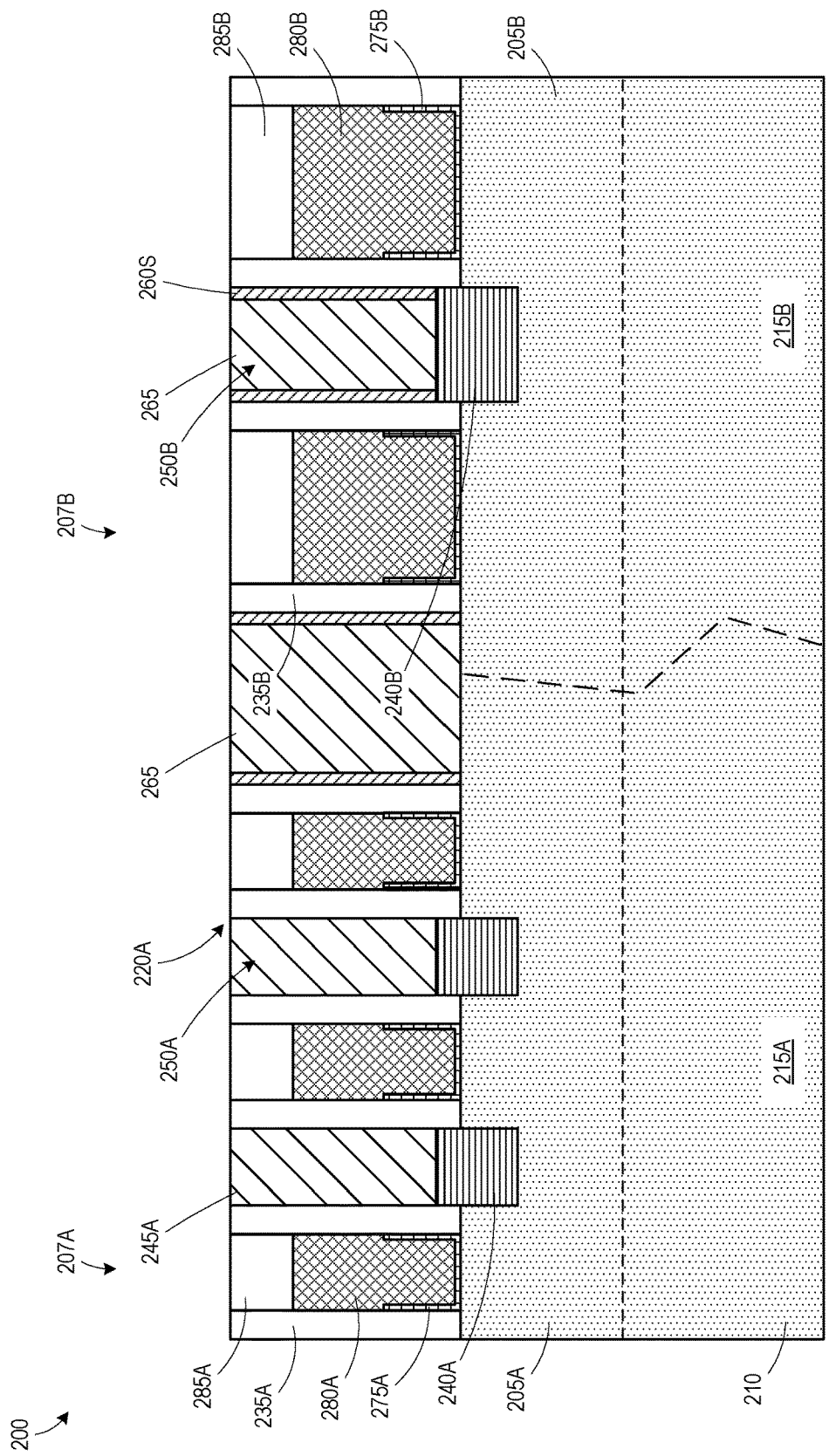

FIG. 2H illustrates the product 200 after a plurality of processes was performed to form gate insulation layers 275A, 275B (e.g., high-k dielectric material (k>10), such as $HfO_2$) and replacement gate electrodes 280A, 280B in the gate cavities 270A, 270B. In one embodiment, the gate insulation layers 275A, 275B may be formed by forming a conformal layer of gate insulation material and by performing a chamfering process to remove portions of the gate insulation material not on the bottoms of the gate cavities 270A, 270B. Chamfering reduces the aspect ratio for the deposition processes used to form the replacement gate electrodes 280A, 280B. To perform the chamfering process, a sacrificial material may be formed in the gate cavities 270A, 270B and recessed to cover the bottom portions of the layer of gate insulation material, and an etch process may be performed to selectively remove the exposed portions of the gate insulation material. A subsequent etch process may be performed to remove the sacrificial material. In other embodiments, the gate insulation layers 275A, 275B may not be chamfered, and thereby line the entire gate cavities 270A, 270B. One or more deposition and/or plating processes may be performed to form the replacement gate electrodes 280A, 280B. The replacement gate electrodes 280A, 280B may include one or more layers (not separately shown), such as a barrier layer, a work function material layer, a seed layer, a metal fill layer, etc. The replacement gate electrodes 280A, 280B may be recessed and gate cap layers 285A, 285B may be formed thereabove. In some embodiments, the replacement gate electrodes 280A may have different materials than the replacement gate electrodes 280B.

Figure 2I:
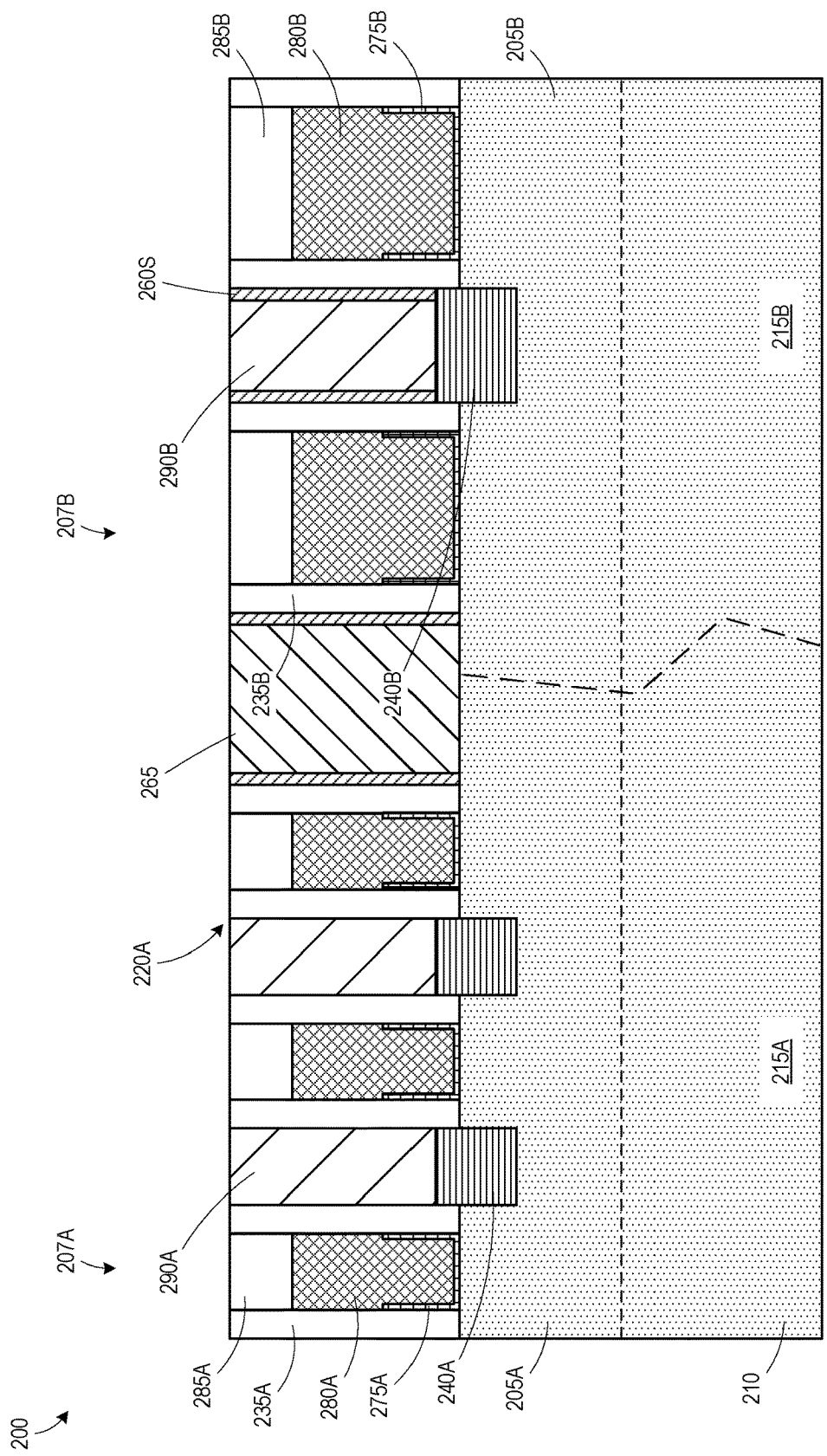

FIG. 2I illustrates the product 200 after a plurality of processes was performed to form source/drain contacts 290A, 290B (e.g., trench silicide materials at the bottom portion, such as silicides of Ti, NiPt, or Ni, and conduction metal in the top portion, such as W, Al, or Cu). An etch process was performed to remove portions of the dielectric layer 265 disposed between the replacement gate electrodes 280A, 280B. One or more deposition processes was performed to form the material of the source/drain contacts 290A, 290B. The presence of the inner spacers 260S increases the amount of dielectric material disposed between the replacement gate electrodes 280B and the source/drain contacts 290B, thereby reducing the likelihood of dielectric breakdown arising from the use of higher voltage signals.

Other steps, not detailed herein, may be performed to complete the product 200, such as doping the source/drain regions, forming additional metallization layers, etc. These processes may be performed prior to or subsequent to the processes described herein.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
forming a first plurality of gate structures;
forming a second plurality of gate structures;
forming a first spacer on each of said first and second pluralities of gate structures, wherein a first cavity is defined between said first spacers of a first pair of said first plurality of gate structures, and wherein a second cavity is defined between said first spacers of a second pair of said second plurality of gate structures;
forming a first source and drain region extending between said first spacers of said first pair and a second source and drain region extending between said first spacers of said second pair after forming said first spacers;
forming a spacer layer above said second pair of said second plurality of gate structures and in said second cavity;
performing an etch process on said spacer layer to remove horizontal portions of said spacer layer above said second pair of said second plurality of gate structures and in said second cavity to form a second spacer in said second cavity on said first spacer of each of said gate structures of said second pair without forming said second spacer in said first cavity;
forming a first contact contacting said first spacers and said first source and drain region in said first cavity; and
forming a second contact contacting said second spacers and said second source and drain region in said second cavity.

2. The method of claim 1, wherein said first plurality of gate structures each has a first gate length, and said second plurality of gate structures each has a second gate length greater than said first gate length.

3. The method of claim 1, wherein said first plurality of gate structures each has a first threshold voltage, and said second plurality of gate structures each has a second threshold voltage greater than said first threshold voltage.

4. The method of claim 1, wherein forming said first spacer on each of said first and second pluralities of gate structures comprises forming said first spacer on each of said first and second pluralities of gate structures concurrently.

5. The method of claim 1, wherein selectively forming said second spacer comprises:
performing a conformal deposition process to form a first dielectric layer above said first and second pluralities of gate structures and in said first and second cavities, wherein said first dielectric layer includes a first non-conformal portion in said first cavity and a second conformal portion in said second cavity;
etching said first dielectric layer to remove said second conformal portion, wherein said first non-conformal portion remains in said first cavity;
forming said spacer layer above said first and second pluralities of gate structures and said first non-conformal portion, and in said second cavities; and
etching said spacer layer to define said second spacer.

6. The method of claim 1, wherein a cap layer is positioned above each of said first and second pluralities of gate structures, and the method further comprises:
forming a dielectric layer in said first and second cavities;
planarizing said dielectric layer to remove said cap layer and expose said first and second pluralities of gate structures; and
replacing said first and second pluralities of gate structures with a first plurality of replacement gate structures and a second plurality of replacement gate structures, respectively.

7. The method of claim 1, further comprising:
removing said first and second pluralities of gate structures to define gate cavities between portions of said first spacer;
forming a gate dielectric layer in said gate cavities; and
forming a conductive material above said gate dielectric layer in said gate cavities.

8. The method of claim 7, wherein said gate dielectric layer only lines a portion of said gate cavities.

9. The method of claim 7, further comprising performing a chamfering process to remove a portion of said gate dielectric layer from an upper region of said gate cavities.

10. A method, comprising:
forming a first plurality of gate structures;
forming a second plurality of gate structures;
forming a first spacer having a first width on each of said first plurality of gate structures, wherein a first cavity is defined between said first spacers of a first pair of said first plurality of gate structures, and a first source and drain region extends between said first spacers of said first pair;
forming a second spacer having a second width greater than said first width on each of said second plurality of gate structures, wherein a second cavity is defined between said second spacers of a second pair of said second plurality of gate structures, a second source and drain region extends between said first spacers of said second pair, and said second spacer covers edge portions of said second source and drain region without covering an upper surface of said second pair of said second plurality of gate structures;
forming a first contact contacting said first spacers and said first source and drain region in said first cavity; and
forming a second contact contacting said second spacers and said second source and drain region in said second cavity.

11. The method of claim 10, wherein said first plurality of gate structures each has a first gate length, and said second plurality of gate structures each has a second gate length greater than said first gate length.

12. The method of claim 10, wherein said first plurality of gate structures each has a first threshold voltage, and said second plurality of gate structures each has a second threshold voltage greater than said first threshold voltage.

13. The method of claim 10, wherein forming said first spacer comprises forming said first spacer concurrently on each of said first and second pluralities of gate structures, and forming said second spacer comprises forming a third spacer on said first spacer in said second cavity, said first and third spacers defining said second spacer.

14. The method of claim 13, wherein forming said third spacer comprises:
performing a conformal deposition process to form a first dielectric layer above said first and second pluralities of gate structures and in said first and second cavities, wherein said first dielectric layer includes a first non-conformal portion in said first cavity and a second conformal portion in said second cavity;

etching said first dielectric layer to remove said second conformal portion, wherein said first non-conformal portion remains in said first cavity;

forming a second dielectric layer above said first and second pluralities of gate structures and said first non-conformal portion, and in said second cavities; and etching said second dielectric layer to define said third spacer.

15. The method of claim 10, wherein a cap layer is positioned above each of said first and second pluralities of gate structures, and the method further comprises:

forming a dielectric layer in said first and second cavities;

planarizing said dielectric layer to remove said cap layer and expose said first and second pluralities of gate structures; and replacing said first and second pluralities of gate structures with a first plurality of replacement gate structures and a second plurality of replacement gate structures, respectively.

16. The method of claim 10, further comprising:

removing said first and second pluralities of gate structures to define gate cavities between portions of said first and second spacers;

forming a gate dielectric layer in said gate cavities; and forming a conductive material above said gate dielectric layer in said gate cavities.

17. The method of claim 16, wherein said gate dielectric layer only lines a portion of said gate cavities.

18. The method of claim 16, further comprising performing a chamfering process to remove a portion of said gate dielectric layer from an upper region of said gate cavities.

* * * * *